United States Patent
Kinney

(10) Patent No.: US 12,094,789 B2
(45) Date of Patent: Sep. 17, 2024

(54) ANALOG SENSE POINTS FOR MEASURING CIRCUIT DIE

(71) Applicant: Micron Technology, Inc., Boise, ID (US)

(72) Inventor: Christopher F. Kinney, Folsom, CA (US)

(73) Assignee: Micron Technology, Inc., Boise, ID (US)

(*) Notice: Subject to any disclaimer, the term of this patent is extended or adjusted under 35 U.S.C. 154(b) by 189 days.

(21) Appl. No.: 17/561,396

(22) Filed: Dec. 23, 2021

(65) Prior Publication Data
US 2023/0207401 A1 Jun. 29, 2023

(51) Int. Cl.
 H01L 21/52 (2006.01)
 H01L 21/66 (2006.01)
 H01L 23/00 (2006.01)
 H01L 23/31 (2006.01)

(52) U.S. Cl.
 CPC ........... *H01L 22/32* (2013.01); *H01L 21/52* (2013.01); *H01L 23/3157* (2013.01); *H01L 24/16* (2013.01); *H01L 24/81* (2013.01); *H01L 2224/16227* (2013.01)

(58) Field of Classification Search
 CPC ..... H01L 22/32; H01L 21/52; H01L 23/3157; H01L 24/16; H01L 24/81; H01L 2224/16227; H01L 23/053; H01L 24/13; G01R 31/2884
 USPC ............................................... 257/48
 See application file for complete search history.

(56) References Cited

U.S. PATENT DOCUMENTS

| | | | | |
|---|---|---|---|---|
| 5,334,857 A | * | 8/1994 | Mennitt | H01L 23/49838 257/E23.125 |
| 5,838,161 A | * | 11/1998 | Akram | G01R 31/2884 324/754.05 |
| 6,297,653 B1 | * | 10/2001 | Hembree | G01R 1/0408 324/754.08 |
| 2012/0146246 A1 | * | 6/2012 | Ko | H01L 21/563 257/782 |
| 2014/0266283 A1 | * | 9/2014 | Wu | H01L 25/0657 324/762.05 |

\* cited by examiner

*Primary Examiner* — Nduka E Ojeh
*Assistant Examiner* — Laura M Dykes
(74) *Attorney, Agent, or Firm* — Schwegman Lundberg & Woessner, P.A.

(57) ABSTRACT

Various embodiments described herein provide analog sense points for circuit die, which can form part of an integrated circuit (IC) package and can facilitate measurement of at least a portion of the circuit die using a Kelvin method of measurement.

14 Claims, 4 Drawing Sheets

ANALOG SENSE POINTS FOR MEASURING CIRCUIT DIE

TECHNICAL FIELD

Embodiments of the disclosure relate generally to voltage measurement and, more specifically, to analog sense points for a circuit die, which can form part of an integrated circuit (IC) package and facilitate measurement of at least a portion of the circuit die using a Kelvin method of measurement.

BACKGROUND

To facilitate debugging or testing of a manufactured circuit, such as a memory integrated circuit (IC) package, the manufactured circuit can include one or more interfaces that enable measurement of signals or voltages generated by the manufactured circuit using external measuring instruments. For instance, while the manufactured circuit is operating, one or more probes of a measuring instruments can be coupled to an interface of a circuit, which can facilitate measurement of a signal or voltage passing through a portion of the circuit. Additionally, a standard interface, such as a JTAG (Joint Test Action Group) interface, can be used in some instances to provide certain measurements as digital data.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
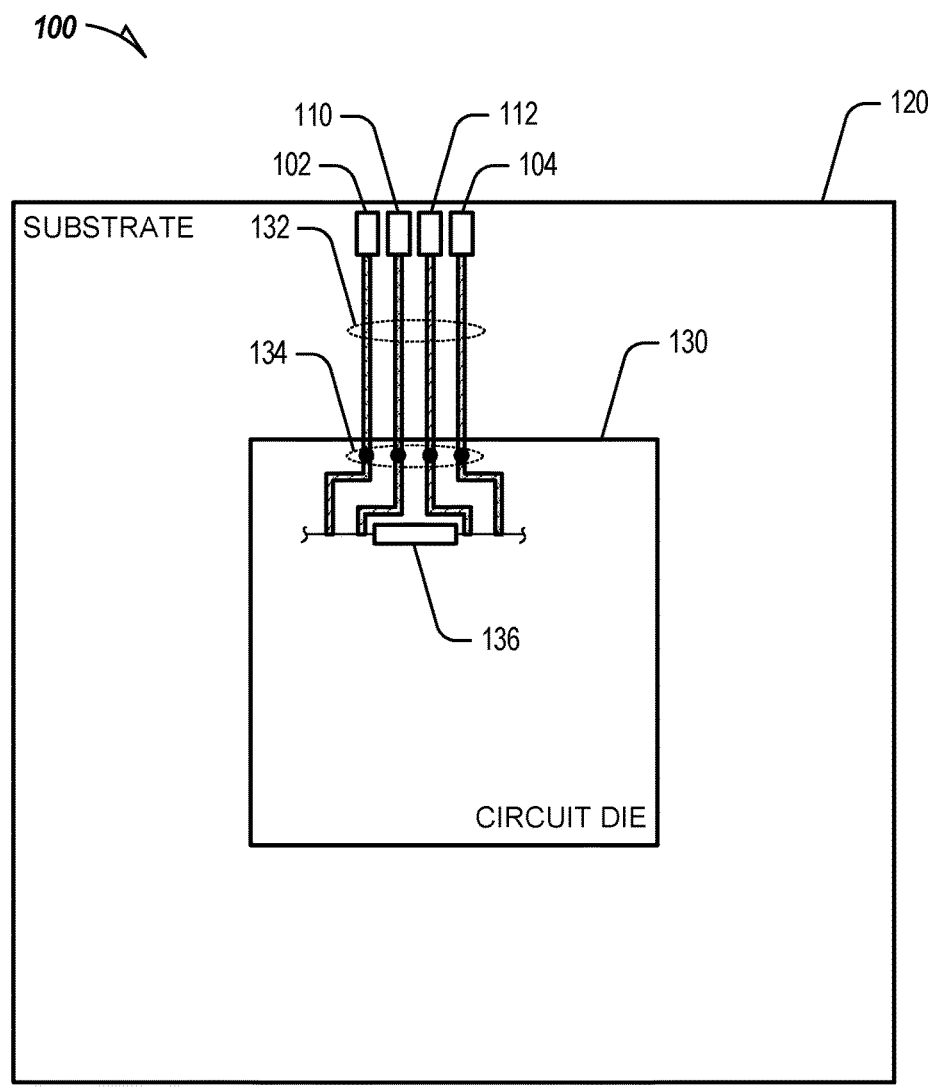
FIG. 1 illustrates an example of analog sense points for a circuit die, in accordance with some embodiments of the present disclosure.

Aspects of the present disclosure are directed to analog sense points for circuit die (or die), which can form part of an integrated circuit (IC) package (e.g., memory circuit die on an IC package) and can facilitate measurement (e.g., voltage measurement) of a portion of the circuit die using a Kelvin method of measuring. In particular, some embodiments provide for one or more analog sense points disposed on a circuit substrate or substrate, such as a printed circuit board (PCB), of an integrated circuit (IC) package, where the one or more analog sense points facilitate a measurement with respect to a die of the IC package that is mounted on the substrate. For instance, an embodiment described herein can be implemented with respect to a circuit die of a memory sub-system. As used herein, a memory sub-system can be a storage device, a memory module, or a hybrid of a storage device and memory module. In general, a host system can utilize a memory sub-system that includes one or more memory components (also hereinafter referred to as "memory devices"). The host system can provide data to be stored at the memory sub-system and can request data to be retrieved from the memory sub-system.

IC packages often rely on digital methods for measuring voltage of the IC packages. Such digital methods usually provide the voltage measurement as digital data via a JTAG (Joint Test Action Group) or similar interface on the IC package. Unfortunately, IC packages suffer from high resistance and inductance, which can result in errors in the measuring provided by the digital methods. Additionally, resolution provided by digital voltage measurement methods can be limited.

Kelvin sense points facilitate a Kelvin method for measuring a circuit (e.g., voltage, current, resistance, or impedance thereof) with reduced measurement errors. Generally, a Kelvin method of measurement (also referred to as four-point sensing) is an analog method of measurement, which can be used to measure voltage via four sense points (e.g., probes or electrodes)—one pair of points (also referred to as force points) that is used to measure resistance or impedance (hereafter, resistance/impedance) of a portion of a circuit (e.g., by driving a known current through a portion of a circuit) and another pair of points (also referred to as sense points) that is used to measure voltage of the portion. Additionally, even without using the pair of points for the current, the other pair of points can be used to measure voltage of the portion based on a known or unknown current already flowing through the portion during operation of the circuit. Accordingly, depending on the embodiment, two sense points (e.g., Kelvin sense points) can be used to measure voltage, or four points (e.g., Kelvin sense points) can be used to measure resistance or impedance. Use of a Kelvin method can avoid measurement errors (e.g., voltage measurement errors) that result from inductance or resistance in wires of a circuit. Though Kelvin voltage sense points are useful in measuring a voltage of a circuit, Kelvin voltage sense points are not currently used with respect to IC packages.

Aspects of the present disclosure address the deficiencies of conventional methods of measuring voltage of a die of an IC package. According to various embodiments, one or more analog sense points (e.g., pads) are disposed, or embedded, on a top layer (e.g., top side) of a substrate of an IC package, which can facilitate accurate voltage measurement of at least a portion of a circuit die (or die) of the IC package that is mounted on the substrate. In particular, the one or more analog sense points disposed on the top layer of the substrate can facilitate a Kelvin method for measuring a voltage of the die. The one or more analog sense points can serve as Kelvin sense points and facilitate a Kelvin connection between the die and one or more measuring instruments, such as an oscilloscope, a voltmeter, a galvanometer, or a multimeter. For instance, with respect to measuring a portion of a circuit die, the one or more analog sense points comprises one pair of analog sense points that is used to measure voltage of the portion. These two (Kelvin) sense points for measuring voltage has little or no current flowing along its sense lines and, thus, the resistance and inductance do not affect the voltage measurement. In another instance, the one or more analog sense points comprises one pair of analog sense points that is used to measure resistance/impedance of the portion, and another pair of analog sense points that is used to measure voltage of the portion. The first pair of analog sense points can be conductively coupled to outer probe points with respect to the portion, while the second pair of analog sense points can be conductively coupled to inner probe points that are closer with respect to the portion. An example of this is illustrated with respect to FIG. 1. The substrate can comprise a printed circuit board (PCB) of an IC package. By way of analog sense points described herein, high frequency voltages generated by the die can be measured, such as voltages at 1-10 GHz.

For some embodiments, the one or more analog sense points comprise one or more conductive pads (e.g., metal pads) disposed on the substrate. Additionally, an analog sense pad can comprise a solder bump (or bump) disposed on a conductive pad. The die of the IC package can comprise a flip-chip BGA or a wire bond chip with a BGA mounted on the substrate. An analog sense pad can be operatively coupled to the die of the IC package by way of a conductive path (e.g., a wire or a trace) disposed on the substrate.

For some embodiments, one or more analog sense points are disposed at or near a periphery or edge of an IC package. In this way, the one or more analog sense points can be disposed where there is less route density than, for example, near a die at a center of the IC package, thereby enabling the one or more analog sense points to have larger dimensions than would otherwise be possible. Some embodiments can be implemented by removing one or more of a package lid, encapsulant, and solder mask of an IC package to expose one or more conductive pads (e.g., metal pads) to be used as one or more analog sense pads.

A voltage measurement using top-layer, analog sense points of an embodiment can enable testing and debugging of an IC package, while at least reducing voltage measurement errors. For instance, the top of a substrate outside the circuit die area can be exposed and used for probe points (e.g., with the lid removal description).

By embedding the analog sense pads to the top layer of an IC package as described herein, various embodiments can provide measurement of voltage at a circuit die, including high-frequency voltage (e.g., 1-10 GHz), with a higher level of resolution and accuracy than traditional methodologies. Additionally, the analog sense pads described herein can provide measurement of a voltage at a circuit die while reducing or avoiding measurement errors caused by resistance of the IC package or filtering (e.g., of high-frequency voltage) caused by inductance of the IC package. Top layer voltage sense pads of an embodiment can obviate the need for extra bottom side pins for an IC package, which can be expensive and can increase the footprint of the IC package. Additionally, some embodiments can be used as an alternative to using a digital method for measuring voltage of a circuit of an IC package, which can provide a less accurate voltage measurement. The use of some embodiments provides physical access for measuring voltage of a portion of a circuit die (e.g., by placing exposed points on the top of a substrate, regardless of if a lid is used or not), where physical access to a circuit die for such a measurement would be otherwise difficult. Conventional substrate connections at a circuit die are generally not accessible, and lie on top of the substrate and connects between. For conventional substrate connections, there is also no room at the bottom of the package pins since these are reserved (e.g., for important signals and power).

Though various embodiments are described herein with respect to pads, it will be understood that for some embodiments the analog sense points can be implemented by different means. Additionally, though various embodiments are described herein with respect to measuring voltage, it will be understood that for some embodiments the analog sense points can be used to measure other aspects of a circuit die, such as resistance/impedance or current.

As used herein, a Kelvin method for measuring can also be referred to as four-wire sensing or four-point probes method. Additionally, as used herein, a measuring instrument can comprise a device that measures voltage, current, resistance, impedance, or some combination thereof with respect to a circuit. Examples of measuring instruments can include oscilloscopes, voltmeters, galvanometers, and multimeters.

Disclosed herein are some examples of IC packages that include or use voltage sense points as described herein, which can be used to measure voltage using a Kelvin method.

FIG. 1 illustrates an example of analog sense points 102, 104, 110, 112 for a circuit die 130, in accordance with some embodiments of the present disclosure. For illustrative purposes, FIG. 1 only presents a simplified representation of analog sense points, on a substrate, that are operatively coupled to a circuit die mounted to the substrate, and excludes additional details that would be typically found in a real-world application of an embodiment.

In FIG. 1, a circuit 100 comprises a substrate 120, a circuit die 130 mounted on a top side of the substrate 120, and analog sense points 102, 104, 110, 112 disposed on the top side of the substrate 120. As shown, the analog sense points 102, 104, 110, 112 are disposed at or near the outer perimeter or edge of the substrate 120, which enables the analog sense points 102, 104, 110, 112 to avoid route congestion at or near the circuit die 130 that would limit the size of the analog sense points 102, 104, 110, 112. Additionally, each of the analog sense points 102, 104, 110, 112 can comprise a conductive pad (e.g., metal pad), which can further have a solder ball (e.g., bump) disposed thereon.

For various embodiments, the substrate 120 comprises a printed circuit board. A plurality of connections can be disposed on a bottom side of the substrate 120. For instance, a pin grid array or a ball grid array can be disposed on the bottom side of the substrate 120, which can enable the substrate 120 to operatively couple to a larger circuit (e.g., a larger printed circuit board having a chip socket configured to receive and operatively couple to the substrate 120). By disposing the analog sense points 102, 104, 110, 112 on the top side of the substrate 120, various embodiments can obviate the need for extra connection (e.g., conductive) elements (e.g., pins or balls) disposed on the bottom side of the substrate 120. This can not only reduce the overall cost of manufacturing the circuit 100, but can also avoid having to increase the footprint of the substrate 120.

The analog sense points 102, 104, 110, 112 are conductively coupled to a portion 136 of the circuit die 130 by way of conductive paths 132. One or more of the conductive paths 132 can comprise a wire or trace disposed on the top side of the substrate 120. The circuit die 130 can comprise, for example, a flip-chip ball grid array (BGA), where the conductive paths 132 couple the analog sense points 102, 104, 110, 112 to connection elements 134 (e.g., solder ball or bumps) of the ball grid array of the circuit die 130, and where the connection elements 134 couple to corresponding points with respect to portion 136. Though not illustrated, alternatively the circuit die 130 can comprise a wire bond ball grid array (BGA), where wires couple the analog sense points 102, 104, 110, 112 to connection elements of the ball grid array on a top side of the circuit die 130 (e.g., by way another substrate disposed on the ball grid array of the circuit die 130). Additionally, where the circuit die 130 comprises a wire bond BGA and the circuit 100 forms part of an IC package, the top side of the substrate 120 and the circuit die 130 can be covered by an epoxy (or other filling) such that the epoxy (or other filling) is not disposed over the analog sense points 102, 104, 110, 112. For instance, during manufacturing the epoxy can be removed from above the analog sense points 102, 104, 110, 112, thereby providing probe access to the analog sense points 102, 104, 110, 112.

The portion 136 can represent one or more components of the circuit die 130. According to various embodiments, the analog sense points 102, 104 are configured to provide a resistance or impedance measurement for the portion 136, and the analog sense points 110, 112 are configured to provide a voltage measurement across the portion 136. As shown, the analog sense points 110, 112 are coupled closer on the conductive path of the portion 136 than the analog sense points 102, 104. In view of this, one or more measuring instruments (e.g., probes thereof) can couple to the analog sense points 102, 104, 110, 112 to form a Kelvin connection, which can enable the one or more measuring instruments to measure voltage across the portion 136 using a Kelvin method. Accordingly, in the context of the Kelvin method of measurement, the analog sense points 102, 104 can represent force points or probes, and the analog sense points 110, 112 can represent sense points or probes. According to some embodiments, by forming a Kelvin connection with the analog sense points 102, 104, 110, 112, the one or more measuring instruments can measure a high-frequency voltage (e.g., 1-10 Ghz) at the circuit die 130 (across the portion 136), can do so with a higher resolution than traditional technologies, and can do so while avoiding measurement errors (e.g., caused by resistance or inductance caused by IC packaging, etc.).

Figure 2:
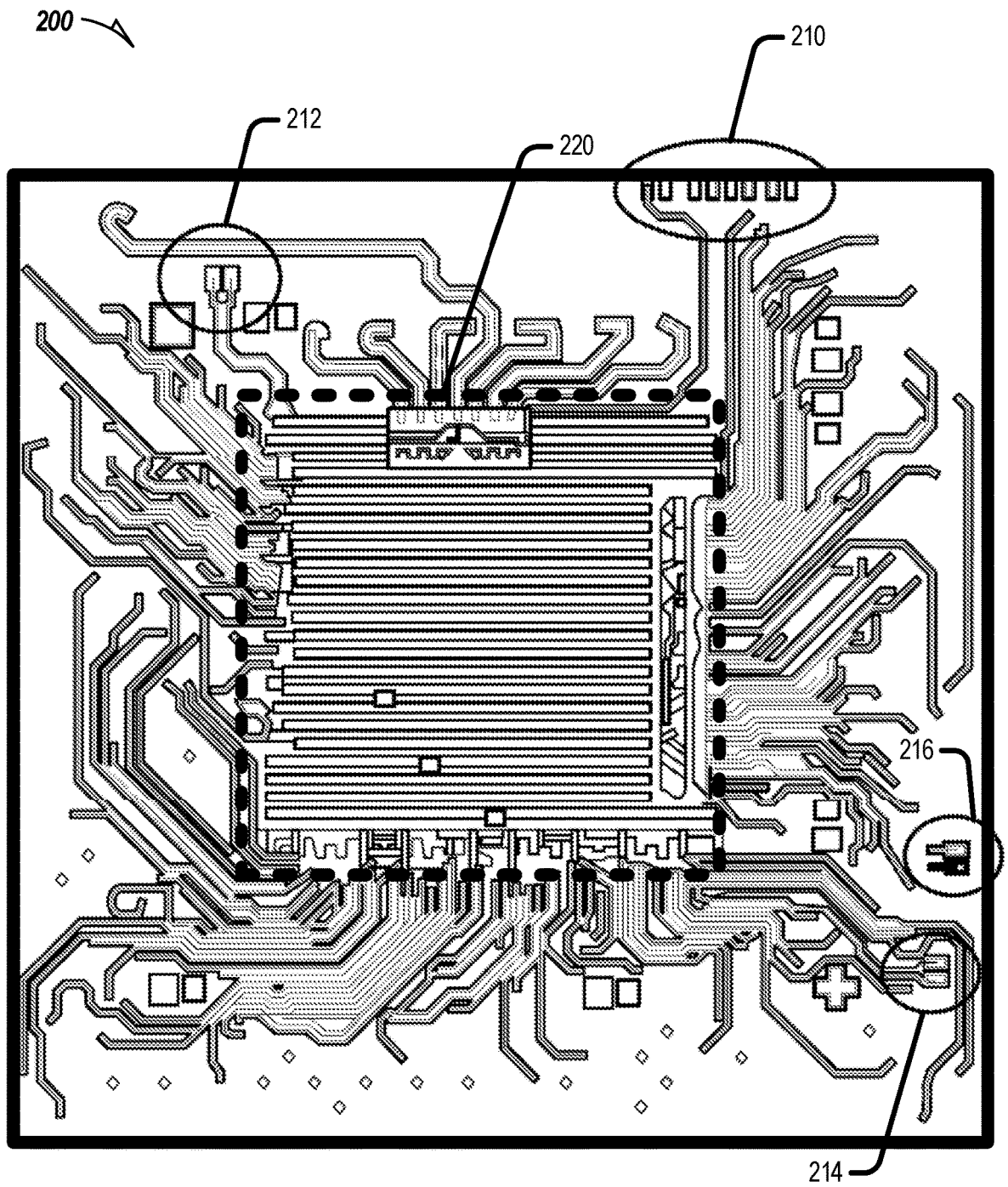
FIG. 2 illustrates example analog sense points implemented with respect to a substrate of an integrated circuit package, in accordance with some embodiments of the present disclosure.

FIG. 2 illustrates example analog sense points implemented with respect to a substrate 200 of an IC package, in accordance with some embodiments of the present disclosure. In FIG. 2, a top side of the substrate 200 includes analog sense pads 210, 212, 214, 216, which are conductively coupled to the center portion 220 of the substrate 200. According to various embodiments, the center portion 220 of the substrate 200 corresponds to a location on the substrate 200 where a circuit die would mount, and operatively couple, to the substrate 200. The traces disposed on the substrate 200 can couple to connection elements of a circuit die mounted to the substrate 200. Additionally, at least some of those traces can couple one or more of the analog sense pads 210, 212, 214, 216 to corresponding connection elements of the circuit die, which can facilitate one or more Kelvin connections with one or more portions of the circuit die as described herein.

Figure 3:
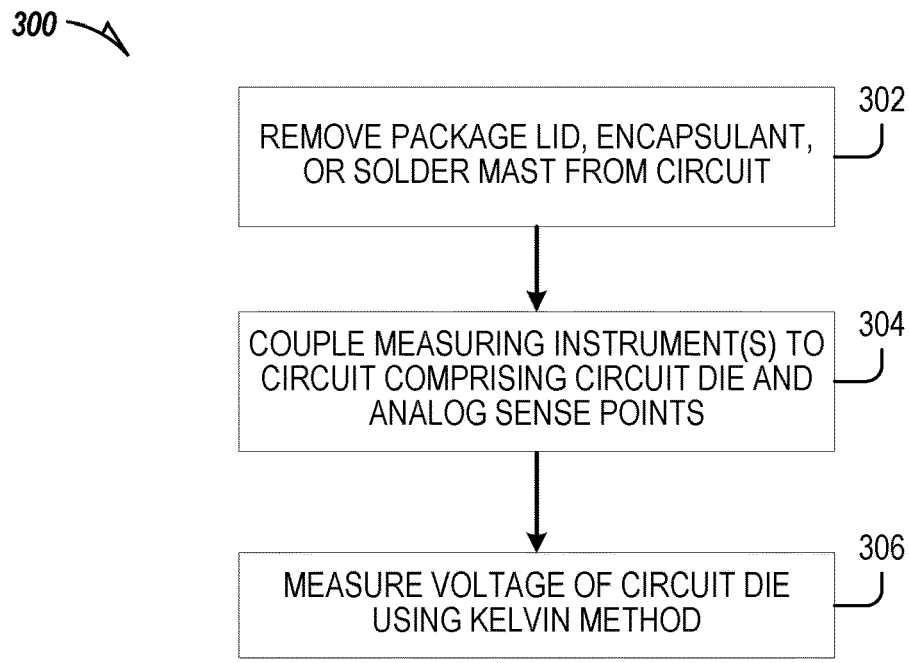
FIG. 3 is a flowchart illustrating an example method for using analog sense points to measure a circuit die, in accordance with some embodiments of the present disclosure.

FIG. 3 is a flowchart illustrating an example method 300 for using analog sense points to measure a circuit die, in accordance with some embodiments of the present disclosure. For instance, the method 300 can be performed with respect to the circuit 100 of FIG. 1 or with respect to the substrate 200 of FIG. 2. Depending on the embodiment, the method 300 can be performed during testing or debugging of a circuit, or more specifically, the circuit die coupled to the analog sense points.

Initially, at operation 302, a user can remove a package lid, encapsulant, a solder mask, or some combination thereof from a circuit (e.g., 100), which can expose analog sense points (e.g., 102, 104, 110, 112) of the circuit (e.g., 100) and render them accessible by probes of one or more measuring instruments. Operation 302 can be performed where the circuit (e.g., 100) forms part of a IC package.

At operation 304, a user (e.g., electrical engineer or technician) couples one or more measuring instruments to a plurality of analog sense points (e.g., 102, 104, 110, 112) of a circuit (e.g., 100) comprising the analog sense points and a circuit die (e.g., 130). For various embodiments, the circuit (e.g., 100) comprises a substrate (e.g., 120) having a top side, and the circuit die (e.g., 130) is mounted to the top side of the substrate (e.g., 120). Additionally, the analog sense points (e.g., 102, 104, 110, 112) are disposed on the top side of the substrate (e.g., 120), and the analog sense points are operatively coupled to the circuit die (e.g., 130) such that the analog sense points are configured to provide a voltage measurement for a portion (e.g., 136) of the circuit die (e.g., 130). According to various embodiments, the analog sense points (e.g., 102, 104, 110, 112) comprise a first sub-plurality (e.g., pair) of analog sense points (e.g., 110, 112) for measuring voltage of the portion (e.g., 136) and a second sub-plurality (e.g., pair) of analog sense points (e.g., 102, 104) for measuring resistance or impedance of the portion (e.g., 136). In view of this, the one or more measuring instruments can be coupled to the analog sense points (e.g., 102, 104, 110, 112) such that voltage probes of the one or more measuring instruments are coupled to the first sub-plurality of analog sense points (e.g., 110, 112), and current/resistance/impedance probes of the one or more measuring instruments are coupled to the second sub-plurality of analog sense points (e.g., 102, 104). This can represent the one or more measurement instruments forming a Kelvin connection with respect to the portion (e.g., 136) of the circuit die (e.g., 130) by way of the analog sense points (e.g., 102, 104, 110, 112).

For some embodiments, voltage of the portion (e.g., 136) is measured by the first sub-plurality of analog sense points (e.g., 110, 112). Additionally, for some embodiments, resistance/impedance of the portion (e.g., 136) is measured by driving a known current the second sub-plurality of analog sense points (e.g., 102, 104), measuring voltage of the portion (e.g., 136) using the first sub-plurality of analog sense points (e.g., 110, 112), and determining the resistance or impedance of the portion (e.g., 136) using the known current and the measured voltage (e.g., resistance equals the measured voltage divided by the known current (R=V/I)). Resistance can be without any time varying signal (e.g., direct current (DC)), and impedance can be with a time varying signal (e.g., alternating current (AC)), where impedance includes resistance plus the effects of inductance and capacitance.

Eventually, at operation 306, a voltage of the portion (e.g., 136) is measured by the one or more measuring instruments using a Kelvin method of measurement. The one or more measuring instruments used can include, without limitation, an oscilloscope, a voltmeter, a galvanometer, or a multimeter.

Figure 4:
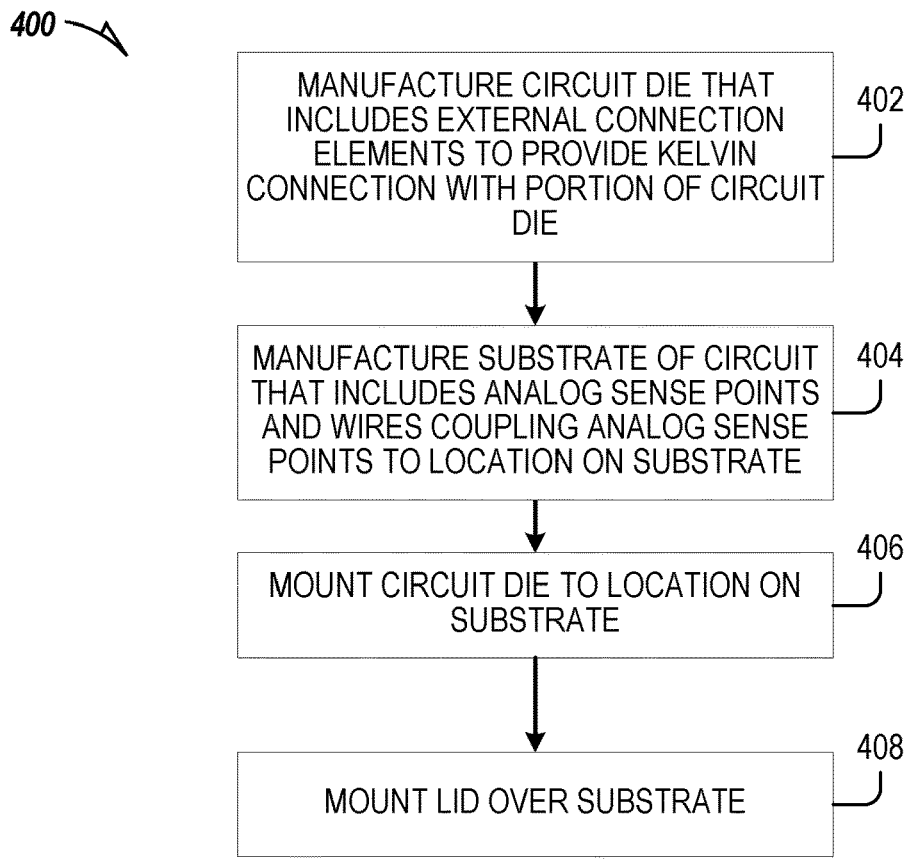
FIG. 4 is a flowchart illustrating an example method for manufacturing a circuit that includes analog sense points to measure a circuit die, in accordance with some embodiments of the present disclosure.

FIG. 4 is a flowchart illustrating an example method 400 for manufacturing a circuit that includes analog sense points to measure a circuit die, in accordance with some embodiments of the present disclosure. For example, the method 400 can be used to manufacture a circuit similar to the circuit 100 of FIG. 1 or a substrate similar to the substrate 200 of FIG. 2.

At operation 402, a circuit die is manufactured that includes a plurality of external connection elements (e.g., pins, bumps, or solder balls) that are configured to provide a Kelvin connection with a portion (e.g., internal component or electrical path) of the circuit die. For instance, where the circuit die comprises a ball grid array (BGA) as part of its external connection elements, at least two connection elements (e.g., four connection elements of 134 of FIG. 1) of the ball grid array (e.g., bumps or solder balls) can be configured to provide a Kelvin connection with the portion (e.g., 136 of FIG. 1). In particular, the circuit die can include internal routing or wiring that operatively couples the at least four connection elements to the portion of the circuit die such that when one or more measuring instruments are coupled to the at least two connections (by way of analog sense pads on the substrate), a Kelvin connection is formed between the one or more measuring instruments and the portion of the circuit die. Additionally, the external connection elements (e.g., at least four connection elements of the ball grid array) can be positioned such that once the circuit die is mounted to a substrate as described herein, those external connection elements operatively couple to conductive paths (e.g., wires or traces) on the substrate that operatively couple to analog sense pads on the substrate.

During operation 404, a substrate (e.g., 120 of FIG. 1) of a circuit is manufactured, where the substrate comprises a plurality of analog sense points (e.g., 102, 104, 110, 112 of FIG. 1) disposed on a side of the substrate, and a plurality of conductive paths (e.g., 132 of FIG. 1) operatively coupling the plurality of analog sense points to a (mount) location, on the side of the substrate, configured to receive a circuit die (e.g., location on the substrate 120 that receives 134 of FIG. 1). Depending on the embodiment, the conductive paths can comprise wires or traces disposed on the substrate.

Thereafter, at operation 406, the circuit die manufactured at operation 402, is mounted to the mount location on the substrate such that the circuit die is operatively coupled to the plurality of analog sense points (e.g., 102, 104, 110, 112 of FIG. 1) by way of the plurality of conductive paths (e.g., 132 of FIG. 1). In this way, the plurality of analog sense points can provide a voltage measurement for the portion (e.g., 136 of FIG. 1) of the circuit die, and can do so by way of a Kelvin connection as described herein. According to some embodiments, the combination of the combination of the substrate with the mounted circuit die forms an IC package, such as a memory IC package.

Eventually, at operation 408, a lid is mounted over the side of the substrate on which the circuit die is mounted. According to various embodiments, the lid is mounted such that the lid at least covers the circuit die. For some embodiments, where the lid is mounted such that lid covers the circuit die and one or more of the plurality of analog sense points, the lid can be removed from the substrate to gain access to the plurality of analog sense points (e.g., for testing or debugging purposes). Generally, the lid can be used to dissipate heat. Additionally, the circuit die can be exposed so that a heat sink can make contact directly to the circuit die. An encapsulant can be used (e.g., like an epoxy or solder mask) to seal and protect the circuit die connections. According to some embodiments, the combination of the substrate with the mounted circuit die and the mounted lid forms an IC package, such as a memory IC package.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A circuit comprising:
    a substrate having a top side;
    a circuit die mounted to the top side of the substrate, the circuit die comprising:
        a first pair of connection elements operatively coupled to a conductive path of a portion of the circuit die to enable voltage measurement of the portion; and
        a second pair of connection elements operatively coupled to the conductive path of the portion to enable at least one of resistance or impedance measurement of the portion, the first pair of connection elements being operatively coupled closer on the conductive path to the portion than the second pair of connection elements;
    an outer pair of analog sense points disposed on the top side of the substrate and at or near an edge of the substrate, the outer pair of analog sense points being for measuring at least one of resistance or impedance of the portion;
    an inner pair of analog sense points disposed on the top side of the substrate, at or near an edge of the substrate, and between the outer pair of analog sense points, the inner pair of analog sense points being for measuring voltage of the portion, the top side of the circuit die being covered by an epoxy such that the epoxy is not disposed over the outer pair of analog sense points and the inner pair of analog sense points;
    an inner pair of traces disposed on the top side of the substrate and operatively coupling the inner pair of analog sense points to the first pair of connection elements; and
    an outer pair of traces disposed on the top side of the substrate and operatively coupling the outer pair of analog sense points to the second pair of connection elements, the outer pair of analog sense points and the inner pair of analog sense points configured to provide the voltage measurement for the portion of the circuit die using a Kelvin method of measurement.

2. The circuit of claim 1, wherein the circuit die comprises a flip-chip ball grid array (BGA), and the first pair of connection elements and the second pair of connection elements are part of the flip-chip ball grid array.

3. The circuit of claim 1, wherein the circuit die comprises a wire bond ball grid array (BGA), the first pair of connection elements and the second pair of connection elements are part of the wire bond ball grid array, and each analog sense point of the outer pair of analog sense points and the inner pair of analog sense points is operatively coupled to the wire bond ball grid array by way of a wire to a top side of the circuit die.

4. The circuit of claim 1, wherein the circuit forms part of an integrated circuit package, and the substrate comprises a printed circuit board.

5. The circuit of claim 1, wherein one of a pin grid array or a ball grid array is disposed on a bottom side of the substrate.

6. The circuit of claim 1, wherein each analog sense point of the outer pair of analog sense points and the inner pair of analog sense points comprises a conductive pad.

7. An integrated circuit package comprising:
    a printed circuit board having a top side and a bottom side, the bottom side having one of a pin grid array or a ball grid array disposed thereon;
    a circuit die mounted to the top side of the printed circuit board, the circuit die comprising:
        a first pair of connection elements operatively coupled to a conductive path of a portion of the circuit die to enable voltage measurement of the portion; and a second pair of connection elements operatively coupled to the conductive path of the portion to enable at least one of resistance or impedance measurement of the portion, the first pair of connection elements being operatively coupled closer on the conductive path to the portion than the second pair of connection elements;

an outer pair of traces disposed on the top side of the printed circuit board and operatively coupling an outer pair of analog sense points to the second pair of connection elements; and an inner pair of traces disposed on the top side of the printed circuit board and operatively coupling an inner pair of analog sense points to the first pair of connection elements, the outer pair of analog sense points and the inner pair of analog sense points configured to provide the voltage measurement for the portion of the circuit die using a Kelvin method of measurement, the top side of the circuit die being covered by an epoxy such that the epoxy not being disposed over the outer pair of analog sense points and the inner pair of analog sense points.

8. The integrated circuit package of claim 7, wherein the circuit die comprises a flip-chip ball grid array (BGA), and the first pair of connection elements and the second pair of connection elements are part of the flip-chip ball grid array.

9. The integrated circuit package of claim 7, wherein the circuit die comprises a wire bond ball grid array (BGA), the first pair of connection elements and the second pair of connection elements are part of the wire bond ball grid array, and each analog sense pad of the outer pair of analog sense points and the inner pair of analog sense points is operatively coupled to the wire bond ball grid array by way of a wire to a top side of the circuit die.

10. A method comprising:

manufacturing a circuit substrate that comprises:

an outer pair of analog sense points disposed on a top side of the circuit substrate and at or near an edge of the circuit substrate, the outer pair of analog sense points being for measuring at least one of resistance or impedance of a portion of a circuit die;

an inner pair of analog sense points disposed on the top side of the circuit substrate, at or near an edge of the circuit substrate, and between the outer pair of analog sense points, the inner pair of analog sense points being for measuring voltage of the portion;

an inner pair of traces disposed on the top side of the circuit substrate and operatively coupling the inner pair of analog sense points to a first pair of connection elements of the circuit die; and an outer pair of traces disposed on the top side of the circuit substrate and operatively coupling the outer pair of analog sense points to a second pair of connection elements of the circuit die, the top side of the circuit die being covered by an epoxy such that the epoxy not being disposed over the outer pair of analog sense points and the inner pair of analog sense points, a location on the top side of the circuit substrate configured to receive the circuit die; and mounting the circuit die to the location such that the circuit die the first pair of connection elements is operatively coupled to the inner pair of traces and such that the second pair of connection elements is operatively coupled to the outer pair of traces, the first pair of connection elements being operatively coupled to a conductive path of the portion to enable voltage measurement of the portion, the second pair of connection elements being operatively coupled to the conductive path of the portion to enable at least one of resistance or impedance measurement of the portion, the first pair of connection elements being operatively coupled closer on the conductive path to the portion than the second pair of connection elements.

11. The method of claim 10, comprising:

mounting a lid over the top side of the circuit substrate such that the lid at least covers the circuit die.

12. The method of claim 10, wherein the circuit die comprises a ball grid array, and the first pair of connection elements and the second pair of connection elements are part of the ball grid array, the method comprising:

manufacturing the circuit die to include the ball grid array.

13. The method of claim 12, wherein the ball grid array is a flip-chip ball grid array (BGA).

14. The method of claim 12, wherein the ball grid array is a wire bond ball grid array (BGA).

* * * * *